United States Patent
Gholami

(10) Patent No.: US 6,297,678 B1
(45) Date of Patent: Oct. 2, 2001

(54) CIRCUIT FOR RAPIDLY CHARGING A SYSTEM NET

(75) Inventor: Ghadir Robert Gholami, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/428,402

(22) Filed: Oct. 28, 1999

(51) Int. Cl.[7] ................................................. H03K 3/02
(52) U.S. Cl. ...................... 327/198; 327/538; 327/541; 323/314
(58) Field of Search ........................... 327/198, 538, 327/540, 541–543, 545–546, 108–111; 326/26–28, 82, 91; 323/312–314; 361/111; 307/42, 147

(56) References Cited

U.S. PATENT DOCUMENTS 5,153,457 * 10/1992 Martin .................................. 326/84
5,489,861 * 2/1996 Seymour ............................ 327/108

* cited by examiner

Primary Examiner—Tuan T. Lam
Assistant Examiner—Minh Nguyen
(74) Attorney, Agent, or Firm—Joseph P. Lally; Mark E. McBurney

(57) ABSTRACT

An electronic system, precharge circuit, and method for precharging system net. The system includes a plurality of devices. Each of the devices includes at least one I/O pin driven by an driver circuit. The system further includes a system net connected to at least one of the I/O pins of each of the plurality of devices. A precharge circuit suitable for connecting to the system net is provided. The precharge circuit includes a sense stage and a charging stage. The sense stage is configured to receive the system net voltage as an input and adapted to sense a system net voltage transition. The charging stage is connected to the system net and configured to receive an output of the sense stage. The sense stage is configured to activate the charging stage in response to detecting a system net voltage transition. The charging stage, upon activation, is configured to provide a current path between a supply voltage and the system net for a specified duration. After the specified duration, the current path is disabled.

22 Claims, 4 Drawing Sheets

CIRCUIT FOR RAPIDLY CHARGING A SYSTEM NET

BACKGROUND

1. Field of the Present Invention

The present invention generally relates to the field of electronic systems and more particularly to an externally supplied circuit for rapidly precharging system nets.

2. History of Related Art

In the design of an electronic system, such as a circuit board populated with a plurality integrated circuit devices that are interconnected with a matrix of interconnects or "nets," it is desirable to precharge the net to a logical level such as the logical high level when the net is tri-stated. Precharging the net can improve system performance by reducing the time required for the net to transition from a high impedance state to a logical high state. If the tri-state voltage is close to or equal the logical high voltage, it will be appreciated that less time is required to transition the signal from the tri-state condition to the logical high condition. Preferably, the precharging circuitry is embedded in the drivers of the devices coupled to the net. Unfortunately, not all devices are designed and implemented with drivers incorporating adequate precharging circuitry. When such "non-conforming" devices are connected to a system net, problems in achieving a desired transition time may arise. More specifically, after a non-conforming device releases control of the net, the net may be in a partially or fully charged state such as a voltage intermediate between the logical high and logical low level. When the net is subsequently driven to a logical level, the amount of time required to transition the net may be in excess of the time permitted by the system timing constraints and the system may incorrectly interpret a logical level on the net. Compounding this problem are the significant difficulties and expense associated with attempting to rework or replace the non-conforming devices. Accordingly, it would be highly desirable to implement a solution that would enable adequate pre-charging of selected system nets without requiring modification of the existing devices.

SUMMARY OF THE INVENTION

The problems identified above are in large part addressed by an electronic system, precharge circuit, and method for precharging system nets according to the present invention. The system includes a plurality of devices. Each of the devices includes at least one I/O pin driven by a driver circuit. The system further includes a system net connected to at least one of the I/O pins of each of the plurality of devices. A precharge circuit suitable for connecting to the system net is provided. The precharge circuit includes a sense stage and a charging stage. The sense stage is configured to receive the system net voltage as an input and adapted to sense a system net voltage transition. The charging stage is connected to the system net and configured to receive an output of the sense stage. The sense stage is configured to activate the charging stage in response to detecting a system net voltage transition. The charging stage, upon activation, is configured to provide a current path between a supply voltage and the system net for a specified duration. After the specified duration, the current path is disabled. With this mechanism, the invention assists in rapidly charging a system net when a transition is sensed by providing a current amplified, low impedance path between the power supply and the system net for a duration sufficient to pre-charge the system net.

BRIEF DESCRIPTION OF THE DRAWINGS

Other objects and advantages of the invention will become apparent upon reading the following detailed description and upon reference to the accompanying drawings in which.

Figure 1:
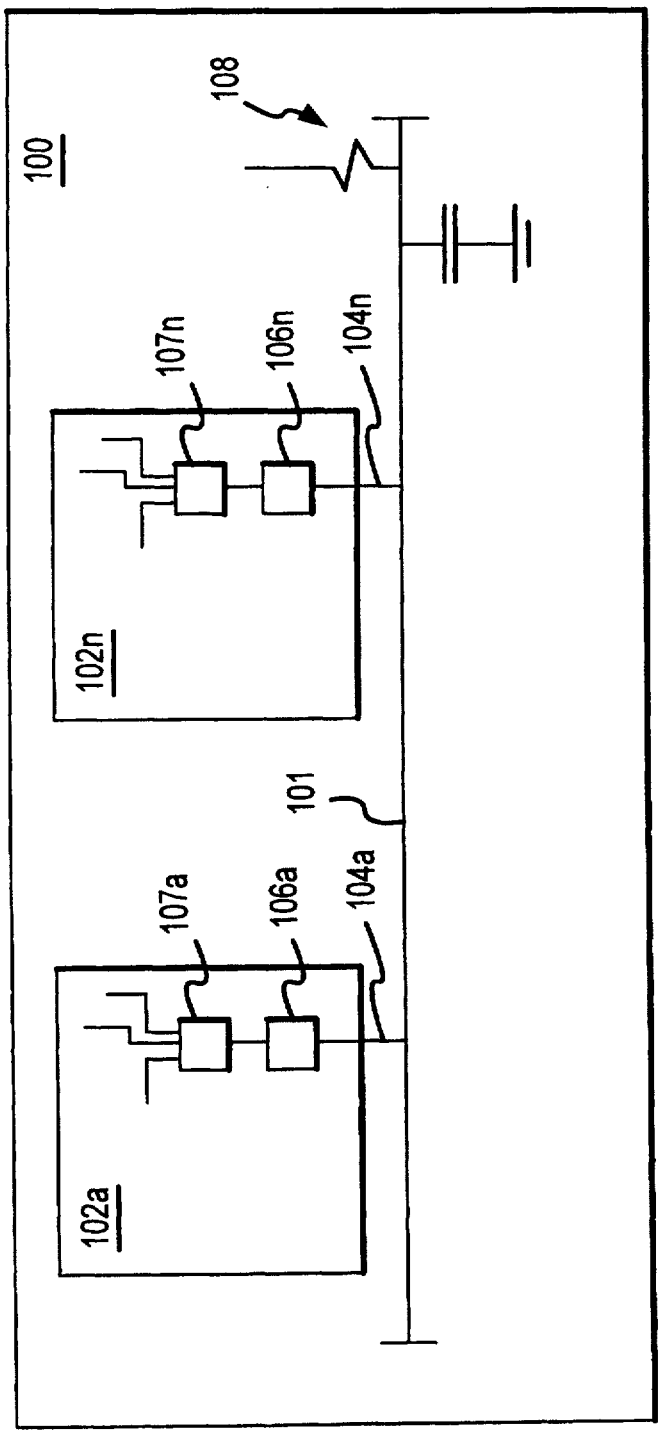
FIG. 1 is a simplified block diagram of an electronic system.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Turning now to the drawings, FIG. 1 presents a simplified block diagram of an electronic assembly or system 100 suitable for receiving an active precharge circuit according to the present invention as described in greater detail below. The system 100 includes a net 101 to which a set of devices 102a through 102n (collectively or generically referred to herein as connector(s) 101 are connected. Each device 102 may comprise, as an example, an integrated circuit or other semiconductor device that includes a plurality of device pins through which signals are communicated to and from the device.

The pins of an integrated circuit may be classified generally into broad categories such as power pins, ground pins, and I/O pins. Power pins are typically connected to a DC power supply. Input and output signals are communicated to and from each device 102 via its I/O pins. Typically, each I/O pin is connected to a driver circuit 106 that is designed to drive net 101 to logical high and logical low levels depending the state of internal circuitry 107 that controls driver circuit 106. For purpose of this disclosure, it is sufficient to note that each device 102 includes an I/O pin 104 that is driven by a driver circuit 106.

Figure 2:
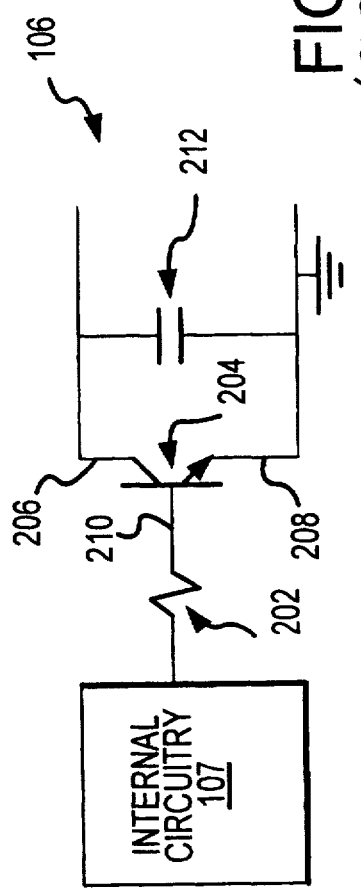
FIG. 2 is a simplified diagram of a driver circuit according to the prior art.

A diagram of a representative non-conforming driver circuit 106 is presented in FIG. 2. For purposes of this disclosure, a non-conforming driver refers to a driver that lacks active precharge circuitry. Driver circuit 106 includes a transistor 204 with its output terminals 206 and 208 connected between I/O pin 104 and ground. The input terminal 210 of transistor 204 is connected in series with an input resistor 202 that is connected to internal circuitry 107 of device 102. Stray capacitance 212 is shown in the diagram of FIG. 2 to convey the existence of undesirable but inevitable capacitance associated with each driver pin 104.

Returning now to FIG. 1, the depicted embodiment of electronic assembly 100 includes a "bus keep" resistor 108 that is connected between net 101 and Vdd to provide a mechanism that pulls net 101 to Vdd when the net is tri-stated (i.e., when the outputs of all driver circuits 106 connected to net 101 are in a high impedance state). As discussed previously, precharging net 101 to Vdd when the net is tri-stated is desirable. Moreover, it is beneficial to precharge a net in the shortest possible time to accommodate high performance busses. Unfortunately the passive charging provided by simply tying net 101 to Vdd through resistor 108 may be insufficient to fully precharge net 101 within the timing constraints of the system. The sum of all stray capacitance 212 contributed by each driver circuit 106 in addition to the stray capacitance of net 101 itself results in an undesirably large capacitive loading on net 101 that can negatively affect the ability to rapidly charge the node. This capacitive loading of net 101 is indicated by the capacitor 112.

The present invention contemplates an active precharge circuit that is suitable for connecting to an existing net to achieve adequate precharging on a system net. The active precharge circuit is most suitably connected to nets that are driven by one or more non-conforming driver circuits. Unfortunately, there exists a large installed base of such non-conforming drivers. In most cases, it is impractical to re-work devices or boards that include these drivers to incorporate internal precharging. To address this problem, the active precharge circuit of the present invention is suitable for being externally connected to an existing system net such that the existing net and its corresponding devices do not have to be reworked in order to achieve the desired pre-charging capability.

Turning now to FIG. 3, system 100 is again depicted with the addition of a driver circuit 300 (shown in simplified block diagram format) according to one embodiment of the present invention. In the depicted embodiment, circuit 300 includes a sense stage 302 configured to receive the voltage of net 101 as an input signal. The output of sense stage 302 is a trigger signal 303. Trigger signals 303 is received as input to a charge stage 304. Sense stage 302 is adapted to sense the voltage of net 101 and to produce manipulate trigger signal 303 based on the sensed voltage.

In one embodiment, sense stage 302 is adapted to trigger operation of charge stage 304 when the sensed voltage transitions from below a threshold value to above the threshold value. Consider a driver circuit 106 that has been driving net 101 to a logical low level (i.e., approximately 0V). If driver circuit 106 is then shut-off such that node 101 is the left in a tristate condition, the voltage of node 101 will begin to rise as the capacitance 112 is charged to Vdd through bus keep resistor 108.

It will be appreciated that the time required to charge node 101 to a desired pre-charged state is a function of the RC time constant of the circuit. In high performance applications, the RC time constant of net 101 may be too large to accommodate the system's operating frequency without the aid of an active precharge circuit. In other words, the passive RC circuit may not charge net 101 quickly enough for the operating frequency of the system. Ideally, net 101 should be fully charged before the next signal transition occurs. If the RC time constant is too long, net 101 will not be fully charged in time for the next signal transition and circuit performance may be negatively affected. In other words, if net 101 rises too slowly, the system may falsely interpret the logical state of net 101. In such cases, precharge circuit 300 is implemented to accelerate pre-charging of the net following a tri-state event. In particular, precharge circuit 300 is suitable for rapidly transitioning net 101 from a logical low to a logical high.

The low-to-high transition is typically the transition of most concern because the high-to-low transition is actively assisted by the design of output driver 106 itself. More specifically, referring back to FIG. 2 momentarily, output driver 106 drives net 101 to a logical low by forward biasing the base-emitter junction of transistor 204 thereby turning on the transistor. When transistor 204 is turned on, a low impedance path between output terminals 206 and 208 of transistor 204, coupled with the current amplification characteristics of bipolar transistors such as transistor 204 combine to actively and rapidly discharge stray capacitance 212 thereby achieving a rapid transition from a high voltage on net 101 to a logical low condition.

A transition to a logical high, however, is achieved by simply turning off transistor 204. Thus, in the case of a low-to-high transition, the design of conventional driver circuits such as driver circuit 106 does not actively assist in the low-to-high the transition. To overcome this limitation, precharge circuit 300 according to a presently preferred embodiment is adapted to actively assist the transition to a logical high level. In the embodiment depicted in FIG. 3, precharge circuit 300 accomplishes the active and rapid precharging of net 101 via charge stage 304. When the sense stage 302 detects a rising transition on net 101, it activates charge stage 304. Charge stage 304 is adapted to provide a low impedance path between Vdd and net 101 after activation for a duration sufficient to charge net 101 to a logical high. After the net 101 has been charged, charge stage 304 enters a high impedance condition in which it is effectively isolated from net 101. In other words, charge stage 304 provides a current path between Vdd and net 101 following activation for a duration sufficient to charge the net. Thereafter, charge stage 304 disables the current path thereby effectively isolated itself from net 101.

Figure 3:
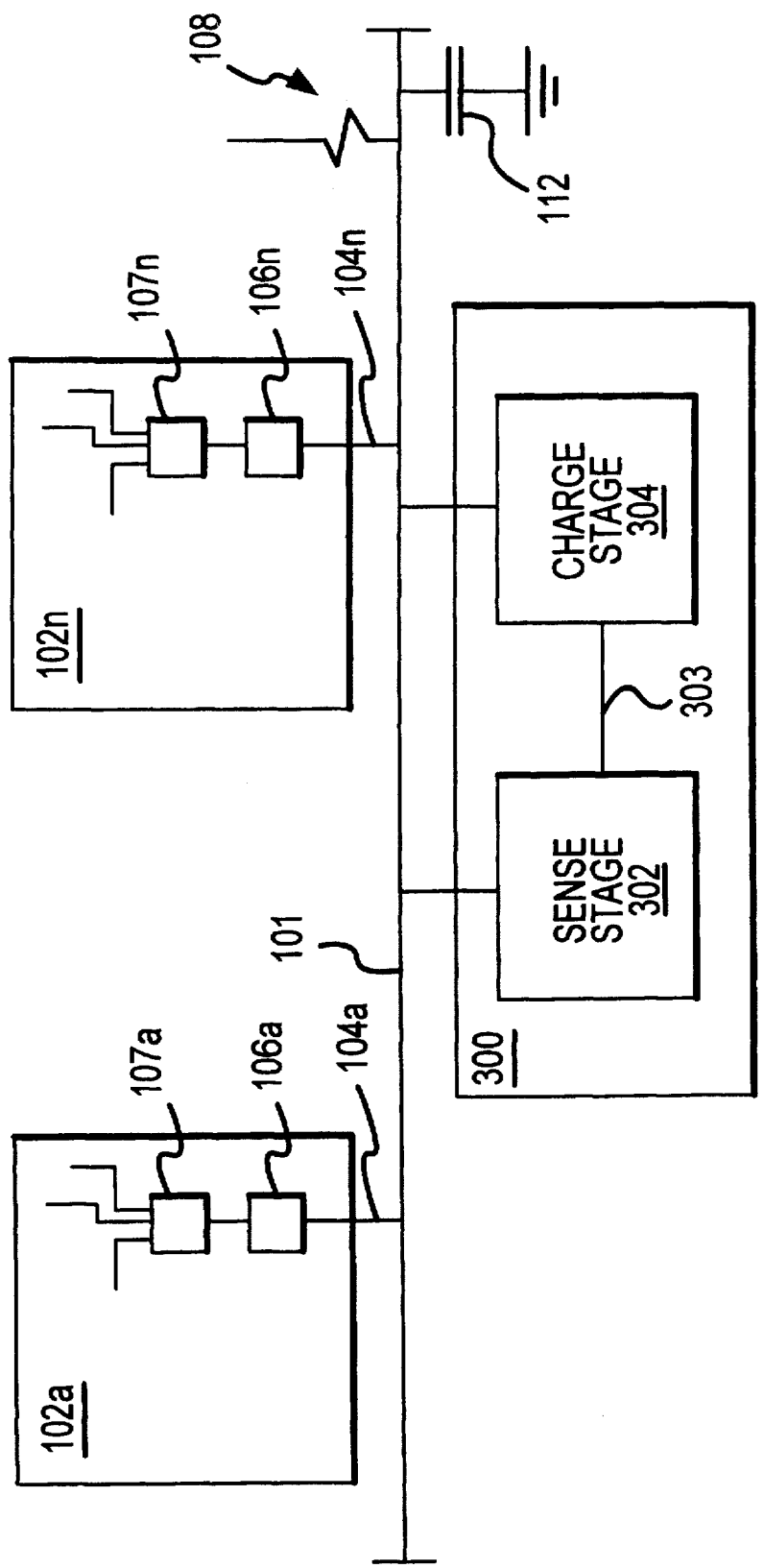
FIG. 3 is simplified block diagram of a precharge circuit according to the present invention connected to the system net of the electronic system of FIG. 1.
Figure 4:
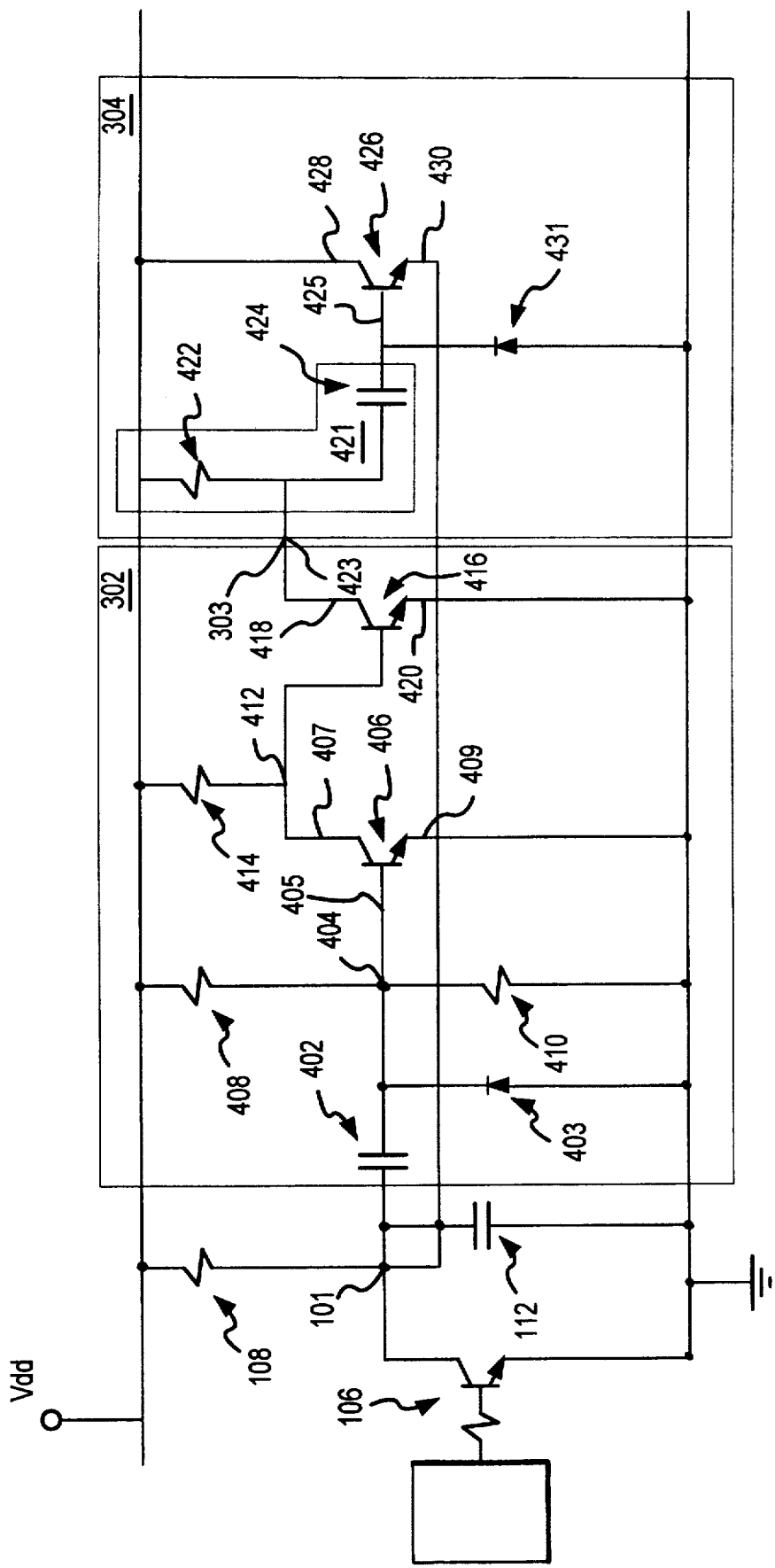
FIG. 4 is a circuit diagram of one embodiment of the precharge circuit of FIG. 3.

Turning now to FIG. 4, a circuit diagram of one embodiment of a precharge circuit 300 is presented. The diagram of FIG. 4 includes a representative model of a driver circuit 106, the bus keep resistor 108 and the capacitance associated with net 101 indicated by reference numeral 112. Although these components are not part of precharge circuit 300, they are presented in FIG. 3 to facilitate discussion of the circuit's operation. Precharge circuit 300 includes a sense stage 302 that receives the voltage of net 101 as an input and a charge stage 304 that is capable of driving net 101 as its output. In the depicted embodiment, sense stage 302 of includes a DC blocking capacitor 402 connected between system net 101 and a first node 404. First node 404 is connected to the input of a triggering transistor 406. In the depicted embodiment, first node 404 is biased to a DC operating point determined by the voltage divider circuit comprised of resistors 408 and 410, which are connected between Vdd and ground. The emitter terminal 409 of triggering transistor 406 is connected to ground in the depicted embodiment while the collector 407 is connected to second node 412. A resistor 414 is tied between Vdd and second node 412, which is further connected to the input of second transistor 416. The emitter 420 of second transistor 416 is grounded while the collector 418 provides a triggering signal 303 (as shown in FIG. 3) to charge stage 304. Charge stage 304 includes a timing circuit 421, to which the triggering signal 303 is connected. Timing circuit 421 includes a timing resistor 422 connected in series with a timing capacitor 424 between Vdd and an input terminal 425 of a charging transistor 426. The collector 428 of charging transistor 426 is connected to Vdd and the emitter 430 is connected back to system net 101. In addition, the depicted embodiment of precharge circuit 300 includes a first discharge diode 403 connect between ground and first node 404 and a second discharge diode 431 connected between ground and the input 425 of charging transistor 426.

When charging transistor 426 is on, a low impedance, actively assisted current path is created between Vdd and system net 101 that provides for rapid charging of net 101. Sense stage 302 is designed to activate charging transistor 426 when a transition in net 101 is detected. If net 101 has been driven to logical low by a driver circuit 106, then net 101 is sitting at essentially 0V. In the DC steady state, resistors 408 and 410 form a voltage divider circuit that biases first node 404 which is connected to the input terminal 405 of triggering transistor 406. In one embodiment, the values of resistors 408 and 410 are selected to bias first node 404 to a voltage just below the saturated base-emitter voltage (Vbesat) of triggering transistor 406. In an embodiment where Vdd is 5 volts, and Vbesat is in the range of approximately 0.6 to 0.7 volts, suitable values for resistors 408 and 410 would be 100 kΩ and 10 kΩ respectively. In this embodiment, first node 404 would be biased in the steady to approximately 0.45 V. If driver circuit 106 stops driving, net 101 will start to rise as capacitance 112 is charged through bus keep resistor 108. As the voltage at net 101 rises, the voltage of first node 404 rises with it due to the capacitive coupling of capacitor 402. When first net 404 reaches a threshold voltage (Vbesat in the depicted embodiment), transistor 406 is activated and second node 412 is pulled down to ground thereby turning off second transistor 416. When second transistor 416 turns off, triggering signal 303 rises rapidly. The input node 425 of charging transistor 426 rises triggering signal 303 due to the coupling of capacitor 424 and turns on charging transistor 426. Initially, after the activation of charging transistor 426, current flows from Vdd to net 101, through the current path formed by the collector-emitter terminals of charging transistor 426. In addition, base current flows from input terminal 425 to emitter terminal 430 through the forward biased base-emitter junction. As this base current continues to flow, stored charge accumulates in capacitor 424 and the voltage at node 423 rises. The rise in voltage at intermediate node 423 is accompanied by a corresponding drop in current through timing circuit 421. Eventually, the timing circuit current is insufficient to maintain the base-emitter junction of charging transistor 426 in a forward biased condition and the transistor shuts off thereby disabling the current path between Vdd and net 101. The time during which charging transistor 426 is on is referred herein as the charging time. It will be appreciated that the charging time is a function of the RC time constant of timing circuit 421. During the charging time, the low impedance path between Vdd and net 101 facilitates rapid charging of system net 101.

In the depicted embodiment, the voltage at which first node 404 turns on triggering transistor 406 is simply the Vbesat of triggering transistor 406. In another embodiment, the turn-on voltage may be manipulated by biasing the collector terminal of triggering transistor 406 with reference voltage value. It will be appreciated that a positive bias applied to emitter terminal 409 of triggering transistor 406 will raise the threshold voltage correspondingly. The depicted embodiment of precharge circuit 300 further includes discharge diodes 403 and 431. Diode 403 provides a current path that enables rapid discharging of capacitor 402 when net 101 transitions from a logical high to a logical low level. Similarly, diode 431 provides a current path for rapidly discharging capacitor 424 when node 423 transitions from Vdd to ground following the turn on of transistor 418.

Figure 5:
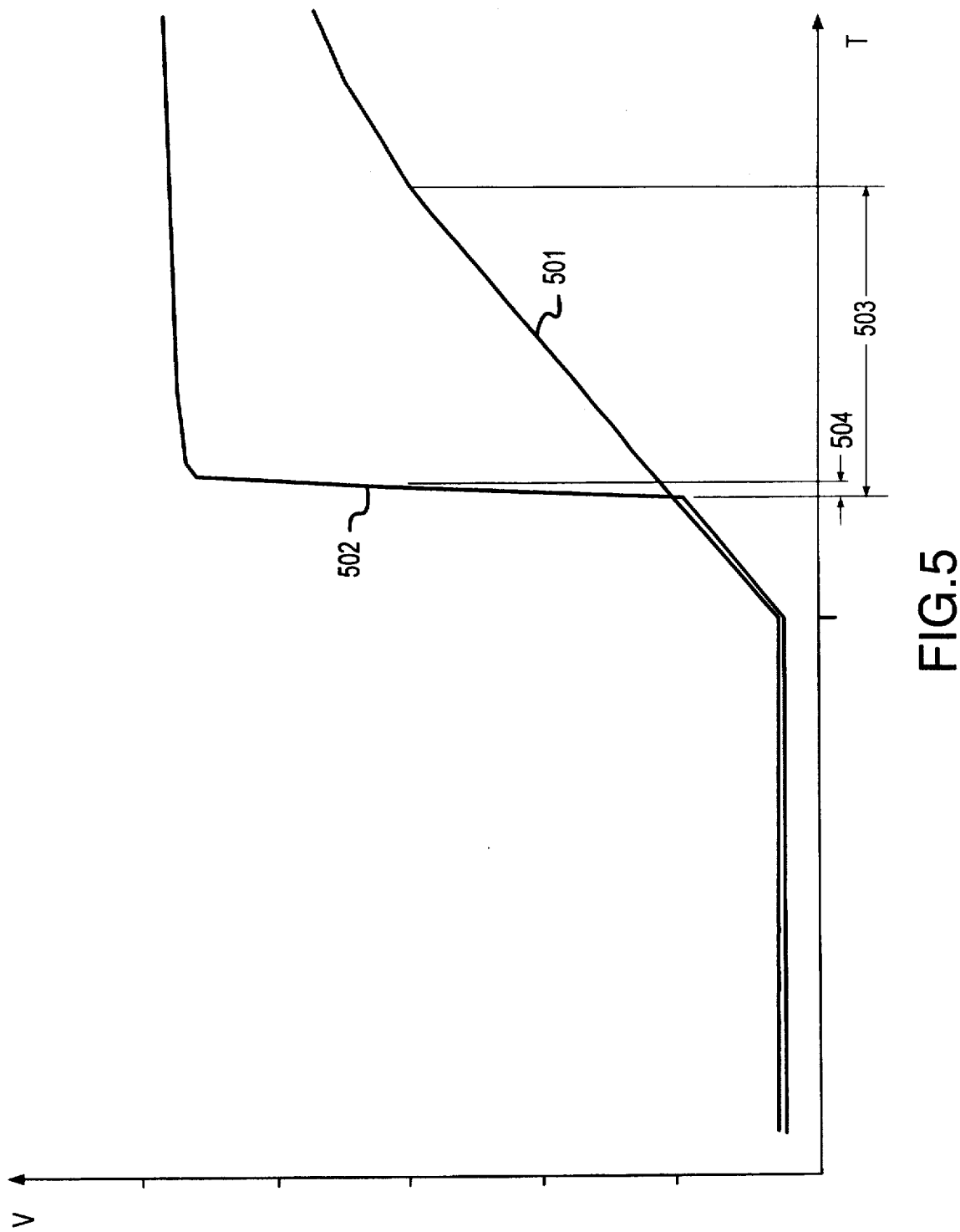
FIG. 5 is a graph illustrating the precharge of a system net both with and without assistance of a precharge circuit according to the present invention.

Turning now to FIG. 5, a diagram illustration the improvement provided by the addition of precharge circuit 300 to a system net 101 that has one or more nonconforming nets connected to it. The first curve 501 indicates the voltage of net 101 as a function of time for a positive going transition in the case where pre-charge circuit 300 is not connected to net 101. With the assistance of an active pre-charging circuit, the voltage of net 101 rises at a less than linear rate. The charging time, indicated as the time required for net 101 to transition from a triggering voltage of approximately 0.7 volts to a transition voltage of approximately 2.7 volts is indicated by reference numeral. In comparison, the second curve 502 illustrates the voltage of net 101 during a positive going transition when assisted by pre-charging circuit 300. When the voltage at net 101 reaches the triggering voltage, it is seen that the voltage of net 101 rises exponentially to well above the transition voltage such that the transition time (indicated by reference numeral 504) of the circuit corresponding to curve 502 is a fraction of transition time 503 required for the circuit corresponding to curve 501.

Thus, it will be apparent to those skilled in the art having the benefit of this disclosure that the present invention contemplates an externally supplied circuit for rapidly pre-charging a system net without requiring extensive rework or modification of the existing system. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of precharging a net in an electronic system, comprising:

connecting a precharge circuit to a system net;

sensing a transition of the system net voltage from a first voltage to a second voltage with the precharge circuit;

responsive to sensing the system net voltage transition, activating a current path between the system net and a supply voltage with the precharge circuit for a duration that is determined by the time constant of an RC circuit in the precharge circuit; and following the charging duration, disabling the current path.

2. The method of claim 1, wherein the sensed transition comprises a transition from a voltage below a threshold level to a value above the threshold level.

3. The method of claim 2, wherein the threshold level is approximately equivalent to the base-emitter voltage of a transistor in the precharge circuit when the transistor is in saturation.

4. The method of claim 1, wherein the activation of the current path comprises turning on a charging transistor connected between the supply voltage and the system net.

5. The method of claim 1, wherein the supply voltage comprises a system Vdd supply.

6. A precharge circuit suitable for connecting to a system net in an electronic system, comprising:

a sense stage configured to receive the voltage of the system net as an input and further configured to sense a voltage transition on the system net, wherein the sense stage includes a dc coupling capacitor in series with the input of a triggering transistor and a second transistor having an input terminal connected to the output of the triggering transistor and;

a charging stage connected to the system net and configured to receive an output of the sense stage;

wherein the sense stage is configured to activate the charging stage in response to detecting the transition of the system net voltage and wherein the charging stage, upon activation, is configured to provide a current path between a supply voltage and the system net for a specified duration determined by an RC time constant of an RC circuit.

7. The precharge circuit of claim 6, wherein the sense stage further comprises a voltage divider circuit connected between the supply voltage and ground, wherein the input of the triggering transistor is connected to the voltage divider.

8. The precharge circuit of claim 6 wherein the emitter of the triggering transistor is connected to ground.

9. The precharge circuit of claim 6 wherein the emitter of the triggering transistor is connected to a reference supply.

10. The precharge circuit of claim 6 wherein the sense stage further comprises a discharge diode connected between ground and the dc coupling capacitor.

11. A precharge circuit suitable for connecting to a system net in an electronic system, comprising:
- a sense stage configured to receive the voltage of the system net as an input and adapted to sense a transition of the system net voltage;
- a charging stage connected to the system net and configured to receive an output of the sense stage;
- wherein the sense stage is configured to activate the charging stage in response to detecting the transition of the system net voltage and wherein the charging stage, upon activation, is configured to provide a current path between a supply voltage and the system net for a specified duration; and
- wherein the charging stage includes a timing circuit comprising a capacitor and resistor in series between the supply voltage and the input of a charging transistor, wherein the timing circuit is configured to maintain the charging transistor in an on condition for a duration after detecting a triggering signal from the sense stage.

12. The precharge circuit of claim 11, wherein the output of the charging transistor is connected between the supply voltage and the system net.

13. The precharge circuit of claim 11, wherein the charging stage further includes a discharge diode connected between ground and the input of the charging transistor.

14. An electronic system comprising:
- a plurality of devices, wherein each of the devices includes at least one a I/O pin driven by a driver circuit;
- a system net connected to the at least one I/O pin of each of the plurality of devices;
- a precharge circuit suitable for connecting to the system net, wherein the precharge circuit comprises:
  - a sense stage configured to receive the system net voltage as an input and further configured to sense a system net voltage transition and;
  - a charging stage connected to the system net and configured to receive an output of the sense stage;
  - wherein the sense stage is configured to activate the charging stage in response to detecting the voltage transition of the system net and wherein the charging stage, upon activation, is configured to provide a current path between a supply voltage and the system net for a specified duration; and
- a bus keep resistor connected between the supply voltage and the system net.

15. The system of claim 14, wherein the sense stage includes a dc coupling capacitor in series with the input of a triggering transistor and a second transistor with an input terminal connected to the output of the triggering transistor.

16. The system of claim 15, wherein sense stage further comprises a voltage divider circuit connected between the supply voltage and ground, wherein the input of the triggering transistor is connected to the voltage divider.

17. The system of claim 15 wherein the emitter of the triggering transistor is connected to ground.

18. The system of claim 15 wherein the emitter of the triggering transistor is connected to a reference supply.

19. The system of claim 15 wherein the sense stage further comprises a discharge diode connected between ground and the dc coupling capacitor.

20. An electronic system, comprising:
- a plurality of devices, wherein each of the devices includes at least one I/O pin driven by a driver circuit;
- a system net connected to the at least one I/O pin of each of the plurality of devices; and
- a precharge circuit suitable for connecting to the system net, wherein the precharge circuit comprises:
  - a sense stage configured to receive the voltage of the system net as an input and adapted to sense a transition of the system net voltage and;
  - a charging stage connected to the system net and configured to receive an output of the sense stage;
  - wherein the sense stage is configured to activate the charging stage in response to detecting the system net voltage transition and wherein the charging stage, upon activation, is configured to provide a current path between a supply voltage and the system net for a specified duration; and
  - wherein the charging stage includes a timing circuit comprising a resistor and a capacitor in series between the supply voltage and the input of a charging transistor, wherein the timing circuit is configured to maintain the charging transistor in an on condition for a duration after detecting a triggering signal from the sense stage.

21. The system of claim 20, wherein the output of the charging transistor is connected between the supply voltage and the system net.

22. The system of claim 20, wherein the charging stage further includes a discharge diode connected between ground and the input of the charging transistor.

* * * * *